United States Patent
Chae et al.

(10) Patent No.: US 9,520,534 B2
(45) Date of Patent: Dec. 13, 2016

(54) LIGHT EMITTING DIODE, METHOD OF FABRICATING THE SAME AND LED MODULE HAVING THE SAME

(71) Applicant: Seoul Viosys Co., Ltd., Ansan-si (KR)

(72) Inventors: Jong Hyeon Chae, Ansan-si (KR); Joon Sup Lee, Ansan-si (KR); Daewoong Suh, Ansan-si (KR); Min Woo Kang, Ansan-si (KR); Hyun A Kim, Ansan-si (KR); Won Young Roh, Ansan-si (KR); Jong Min Jang, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/848,242

(22) Filed: Sep. 8, 2015

(65) Prior Publication Data

US 2016/0072011 A1    Mar. 10, 2016

Related U.S. Application Data

(63) Continuation of application No. 14/848,232, filed on Sep. 8, 2015, which is a continuation of application No. PCT/KR2014/006904, filed on Jul. 29, 2014.

(30) Foreign Application Priority Data

Jul. 29, 2013   (KR) ........................ 10-2013-0089414
Jul. 29, 2013   (KR) ........................ 10-2013-0089415

(51) Int. Cl.
*H01L 29/06*     (2006.01)
*H01L 31/00*     (2006.01)
(Continued)

(52) U.S. Cl.
CPC ............. *H01L 33/14* (2013.01); *H01L 33/005* (2013.01); *H01L 33/007* (2013.01); *H01L 33/06* (2013.01);
(Continued)

(58) Field of Classification Search
CPC ........ H01L 33/62; H01L 33/40; H01L 33/004; H01L 33/005; H01L 33/24; H01L 33/14; H01L 33/06; H01L 33/44; H01L 2933/0016
(Continued)

(56) References Cited

U.S. PATENT DOCUMENTS 6,199,484 B1    3/2001   Martinez-Tovar et al.
6,215,251 B1    4/2001   Orchard-Webb
(Continued)

FOREIGN PATENT DOCUMENTS

JP         2010-267834 A       11/2010

OTHER PUBLICATIONS

Park, Hye Lyun, Authorized Officer, Korean Intellectual Property Office, Written Opinion, International Application No. PCT/KR2014/006904, Nov. 20, 2014, 7 pages.

*Primary Examiner* — Jessica Manno
*Assistant Examiner* — Sheikh Maruf
(74) *Attorney, Agent, or Firm* — Perkins Coie LLP

(57) ABSTRACT

Disclosed are a light emitting diode (LED), an LED module including the same, and a method of fabricating the same. The light emitting diode includes a first conductive-type semiconductor layer; a second conductive-type semiconductor layer; an active layer interposed between the first conductive-type semiconductor layer and the second conductive-type semiconductor layer; a first electrode pad region electrically connected to the first conductive-type semiconductor layer; a second electrode pad region electrically
(Continued)

connected to the second conductive-type semiconductor layer; and a spark gap formed between a first leading end electrically connected to the first electrode pad region and a second leading end electrically connected to the second electrode pad region. The spark gap can achieve electrostatic discharge protection of the light emitting diode.

20 Claims, 14 Drawing Sheets

(51) Int. Cl.
*H01L 33/14* (2010.01)
*H01L 33/38* (2010.01)
*H01L 33/00* (2010.01)
*H01L 33/40* (2010.01)
*H01L 33/62* (2010.01)
*H01L 33/06* (2010.01)
*H01L 33/12* (2010.01)
*H01L 33/32* (2010.01)
*H01L 33/44* (2010.01)

(52) U.S. Cl.
CPC ............... *H01L 33/12* (2013.01); *H01L 33/32* (2013.01); *H01L 33/38* (2013.01); *H01L 33/405* (2013.01); *H01L 33/62* (2013.01); *H01L 33/44* (2013.01); *H01L 2933/0016* (2013.01)

(58) Field of Classification Search
USPC .................. 257/13, 14, 88, 93–99, E33.062, 257/E29.069, E23.08, E33.068; 438/29, 438/33
See application file for complete search history.

(56) References Cited

U.S. PATENT DOCUMENTS

| | | | |
|---|---|---|---|
| 2007/0018186 A1* | 1/2007 | Shin | H01L 33/22 257/98 |
| 2007/0096077 A1* | 5/2007 | Sanga | H01L 29/205 257/13 |
| 2008/0185606 A1 | 8/2008 | Sano | |
| 2008/0303018 A1* | 12/2008 | Kim | H01L 33/34 257/13 |
| 2009/0098676 A1 | 4/2009 | Soejima et al. | |
| 2010/0213469 A1 | 8/2010 | Locke | |
| 2011/0284908 A1* | 11/2011 | Muramoto | H01L 33/38 257/98 |
| 2013/0105845 A1* | 5/2013 | Kim | H01L 27/156 257/98 |
| 2013/0214320 A1 | 8/2013 | Onishi | |
| 2014/0361327 A1* | 12/2014 | Chae | H01L 33/22 257/98 |
| 2015/0129915 A1* | 5/2015 | Lee | H01L 33/20 257/98 |
| 2015/0207051 A1* | 7/2015 | Yoon | H01L 33/14 362/382 |
| 2015/0270442 A1* | 9/2015 | Chae | H01L 25/0753 257/88 |
| 2015/0372208 A1* | 12/2015 | Chae | H01L 33/62 257/98 |
| 2016/0190400 A1* | 6/2016 | Jung | H01L 33/502 362/97.1 |
| 2016/0197242 A1* | 7/2016 | Tsai | H01L 33/44 257/98 |

* cited by examiner

LIGHT EMITTING DIODE, METHOD OF FABRICATING THE SAME AND LED MODULE HAVING THE SAME

CROSS REFERENCE TO RELATED APPLICATION

This application is a continuation of and, claims the benefits and priorities to, U.S. patent application Ser. No. 14/848,232, filed on Sep. 8, 2015, and Patent Cooperation Treaty (PCT) Application No. PCT/KR2014/006904, filed on Jul. 29, 2014, which further claims priorities from and the benefits of Korean Patent Application No. 10-2013-0089414, filed on Jul. 29, 2013, and Korean Patent Application No. 10-2013-0089415, filed on Jul. 29, 2013, which are all hereby incorporated by reference for all purposes as if fully set forth herein.

TECHNICAL FIELD

Exemplary embodiments of the disclosed technology relate to a light emitting diode (LED), an LED module including the same, and a method of fabricating the same. For example, some implementations of the disclosed technology relates to a light emitting diode having improved reliability, an LED module including the same, and a method of fabricating the same.

BACKGROUND

Since GaN-based light emitting diodes were first developed, GaN-based LEDs have been used for various applications including natural color LED displays, LED traffic signboards, white LEDs, and the like.

Generally, a GaN-based light emitting diode is formed by growing epitaxial layers on a substrate such as a sapphire substrate, and includes an N-type semiconductor layer, a P-type semiconductor layer and an active layer interposed therebetween. In addition, an n-electrode pad is formed on the N-type semiconductor layer and a p-electrode pad is formed on the P-type semiconductor layer. The light emitting diode is connected to an external power source through the electrode pads and driven thereby. In this case, current flows from the p-electrode pad to the n-electrode pad through the semiconductor layers.

On the other hand, a flip-chip type light emitting diode is used to prevent light loss due to the p-electrode pad while improving heat dissipation efficiency, and various electrode structures are proposed to promote current spreading in a large area flip-chip type light emitting diode. Examples are disclosed in U.S. Pat. No. 6,486,499. For example, a reflective electrode is formed on the P-type semiconductor layer, and extension legs are formed on a region of the N-type semiconductor layer, which is exposed by etching the P-type semiconductor layer and the active layer, to facilitate current spreading.

The reflective electrode formed on the P-type semiconductor layer reflects light generated from the active layer to improve light extraction efficiency and helps current spreading in the P-type semiconductor layer. On the other hand, the extension legs connected to the N-type semiconductor layer help current spreading in the N-type semiconductor layer to allow uniform generation of light in a wide active region. Particularly, a light emitting diode having a large area of about 1 mm$^2$ and used for high power output requires current spreading not only in the P-type semiconductor layer but also in the N-type semiconductor layer.

SUMMARY

Exemplary embodiments of the disclosed technology provide a light emitting diode chip having an electrostatic discharge protection function.

In addition, exemplary embodiments of the disclosed technology provide a light emitting diode which can be directly mounted on a printed circuit board or the like using a solder paste by preventing diffusion of metal elements from the solder paste.

Further, exemplary embodiments of the disclosed technology provide a light emitting diode having improved current spreading performance.

Furthermore, exemplary embodiments of the disclosed technology provide a light emitting diode having improved light extraction efficiency by improving reflectivity.

Furthermore, exemplary embodiments of the disclosed technology provide a light emitting diode capable of simplifying a manufacturing process by reducing the use of photomasks, an LED module including the same, and a method of fabricating the same.

Additional features of the disclosed technology will be set forth in the description which follows, and in part will become apparent from the description, or may be learned from practice of the disclosed technology.

In accordance with one aspect of the present invention, a light emitting diode includes: a first conductive-type semiconductor layer; a second conductive-type semiconductor layer; an active layer interposed between the first conductive-type semiconductor layer and the second conductive-type semiconductor layer; a first electrode pad region electrically connected to the first conductive-type semiconductor layer; a second electrode pad region electrically connected to the second conductive-type semiconductor layer; and a spark gap formed between a first leading end electrically connected to the first electrode pad region and a second leading end electrically connected to the second electrode pad region. The spark gap can achieve electrostatic discharge protection of the light emitting diode.

The light emitting diode may further include an upper insulation layer covering the second conductive-type semiconductor layer. In addition, the upper insulation layer may include an opening that exposes the spark gap. As the spark gap is exposed to the outside, it is possible to prevent generation of static electricity by electrical sparks via air.

The light emitting diode may include a mesa placed on the first conductive-type semiconductor layer. The mesa includes the active layer and the second conductive-type semiconductor layer. The first electrode pad region may be electrically connected to the first conductive-type semiconductor layer at a side of the mesa.

The light emitting diode may further include a reflective electrode structure placed on the mesa; and a current spreading layer covering the mesa and the first conductive-type semiconductor layer, and having an opening that exposes the reflective electrode structure. The current spreading layer is electrically connected to the first conductive-type semiconductor layer while being insulated from the reflective electrode structure and the mesa. Further, the upper insulation layer may cover the current spreading layer and the first leading end may be a portion of the current spreading layer.

The light emitting diode may further include an anti-diffusion reinforcing layer placed on the reflective electrode structure in the opening of the current spreading layer.

Further, the second leading end may be a portion of the anti-diffusion reinforcing layer. Further, the anti-diffusion reinforcing layer may be formed of the same material as that of the current spreading layer.

In addition, the upper insulation layer may include a first opening that exposes the current spreading layer to define the first electrode pad region, and a second opening that exposes the anti-diffusion reinforcing layer to define the second electrode pad region.

The light emitting diode may further include a lower insulation layer placed between the mesa and the current spreading layer and insulating the current spreading layer from the mesa. The lower insulation layer has an opening placed in an upper region of the mesa and exposing the reflective electrode structure.

The spark gap may be placed between the first electrode pad region and the second electrode pad region. The spark gap generates electric sparks when static electricity of high voltage is applied between the first electrode pad region and the second electrode pad region. To this end, a gap between the first leading end and the second leading end may be narrower than other portions. Further, the first leading end and the second leading end may have a semi-circular or angled shape and face each other.

In accordance with another aspect of the present invention, a method of fabricating a light emitting diode includes: forming a first conductive-type semiconductor layer, an active layer and a second conductive-type semiconductor layer on a substrate; patterning the second conductive-type semiconductor layer and the active layer to form a mesa on the first conductive-type semiconductor layer; and forming a first electrode pad region electrically connected to the first conductive-type semiconductor layer and a second electrode pad region electrically connected to the second conductive-type semiconductor layer. Furthermore, the light emitting diode has a spark gap defined between the first leading end electrically connected to the first electrode pad region and the second leading end electrically connected to the second electrode pad region.

The method may further include: forming a reflective electrode structure on the second conductive-type semiconductor layer; and forming a current spreading layer covering the mesa and the first conductive-type semiconductor layer, and having an opening exposing the reflective electrode structure. Here, the current spreading layer forms ohmic contact with the first conductive-type semiconductor layer while being insulated from the mesa.

The current spreading layer allows uniform spreading of current in the first conductive-type semiconductor layer. The first leading end may be a portion of the current spreading layer.

The method may further include forming an anti-diffusion reinforcing layer on the reflective electrode structure. The anti-diffusion reinforcing layer may be formed together with the current spreading layer and the second leading end may be a portion of the anti-diffusion reinforcing layer. Thus, the first and second leading ends can be formed together with the current spreading layer and the anti-diffusion reinforcing layer by the same process.

The method may further include forming an upper insulation layer covering the current spreading layer. The upper insulation layer may have a first opening exposing the current spreading layer to define the first electrode pad region, and a second opening exposing the anti-diffusion reinforcing layer to define the second electrode pad region.

In addition, the upper insulation layer may further include an opening through which the first leading end and the second leading end are exposed. The opening may be distant from the first and second openings.

The method may further include forming a lower insulation layer covering the mesa and the first conductive-type semiconductor layer, before forming the current spreading layer. The lower insulation layer has openings that expose the reflective electrode structure and the first conductive-type semiconductor layer.

The lower insulation layer may include a silicon oxide layer and the upper insulation layer may include a silicon nitride layer.

The method may further include forming an anti-Sn diffusion plating layer on the first electrode pad region and the second electrode pad region using a plating technique.

In accordance with a further aspect of the present invention, a light emitting diode includes: a first conductive-type semiconductor layer; a mesa placed on the first conductive-type semiconductor layer and including an active layer and a second conductive-type semiconductor layer; a reflective electrode structure placed on the mesa; a current spreading layer covering the mesa and the first conductive-type semiconductor layer, and having an opening that exposes the reflective electrode structure, the current spreading layer being electrically connected to the first conductive-type semiconductor layer while being insulated from the reflective electrode structure and the mesa; and an upper insulation layer covering the current spreading layer. In addition, the upper insulation layer has a first opening exposing the current spreading layer to define the first electrode pad region, and a second opening exposing an exposed upper region of the reflective electrode structure to define the second electrode pad region.

Since the first and second electrode pad regions are respectively defined by the first and second openings of the upper insulation layer, there is no need for a separate photomask for forming the first and second electrode pads.

On the other hand, an LED module includes a printed circuit board; and the light emitting diode bonded to an upper side of the printed circuit board. Here, the first electrode pad region and the second electrode pad region are bonded to corresponding pads on the printed circuit boards via solder pastes, respectively.

In some embodiments, the light emitting diode may further include an anti-Sn diffusion plating layer formed on the first electrode pad region and the second electrode pad region.

Unlike typical AuSn solders in the related art, the solder paste is a mixture of a metal alloy and an organic material and is cured by heat treatment to provide a bonding function. Thus, metal elements such as Sn in the solder paste are unlikely to diffuse, unlike metal elements in the typical AuSn solders in the related art.

The anti-Sn diffusion plating layer can prevent the metal elements such as Sn in the solder paste from diffusing into the light emitting diode. Furthermore, as the anti-Sn diffusion plating layer is formed by a plating technique such as electroless plating, there is no need for a separate photomask for formation of the plating layer.

In some embodiments, the light emitting diode may further include an anti-diffusion reinforcing layer placed on the reflective electrode structure in the opening of the current spreading layer. The anti-diffusion reinforcing layer may be exposed through the second opening of the upper insulation layer. The anti-diffusion reinforcing layer can prevent metal elements such as Sn in the solder paste from diffusing to the reflective electrode structure in the light emitting diode.

The anti-diffusion reinforcing layer may be formed of the same material as that of the current spreading layer.

Thus, the anti-diffusion reinforcing layer may be formed together with the current spreading layer, and there is no need for a separate photomask for formation of the anti-diffusion reinforcing layer.

The current spreading layer may include an ohmic contact layer, a reflective metal layer, an anti-diffusion layer, and an anti-oxidation layer. The current spreading layer may form ohmic contact with the first conductive-type semiconductor layer through the ohmic contact layer. For example, the ohmic contact layer may be formed of Ti, Cr, Ni, and the like.

The reflective metal layer reflects light incident on the current spreading layer to increase reflectivity of the light emitting diode. The reflective metal layer may be formed of Al. In addition, the anti-diffusion layer prevents diffusion of metal elements and serves to protect the reflective metal layer. Particularly, the anti-diffusion layer can prevent diffusion of metal elements such as Sn in the solder paste. The anti-diffusion layer may include Cr, Ti, Ni, Mo, TiW, W or combinations thereof. Each of Mo, TiW and W may be used to form a single layer. On the other hand, Cr, Ti, and Ni may be used to form a pair of layers.

Particularly, the anti-diffusion layer may include at least two pairs of Ti/Ni or Ti/Cr layers. The anti-oxidation layer is formed to prevent oxidation of the anti-diffusion layer and may include Au.

The current spreading layer may have a reflectivity of 65% to 75%. Thus, the light emitting diode according to this embodiment of the invention can provide optical reflection by the current spreading layer in addition to optical reflection by the reflective electrode structure, whereby light traveling through a sidewall of the mesa and the first conductive-type semiconductor layer can be reflected.

The current spreading layer may further include a bonding layer placed on the anti-oxidation layer. The bonding layer may include Ti, Cr, Ni or Ta. The bonding layer is used to enhance bonding strength between the current spreading layer and the upper insulation layer.

The solder paste may adjoin the current spreading layer and the anti-diffusion reinforcing layer. Alternatively, the solder paste may adjoin the anti-Sn diffusion plating layer formed on the current spreading layer and the anti-diffusion reinforcing layer.

The reflective electrode structure may include a reflective metal section; a capping metal section; and an anti-oxidation metal section. Furthermore, the reflective metal section may have a slanted side surface such that an upper surface of the reflective metal section has a narrower area than a lower surface thereof, and the capping metal section may cover the upper and lower surfaces of the reflective metal section. Further, the anti-oxidation metal section covers the capping metal section.

A stress relief layer may be formed at an interface between the reflective metal section and the capping metal section. The stress relief layer relieves stress due to a difference in coefficient of thermal expansion between the metal layers formed of different materials.

In addition, the mesa may include elongated branches extending parallel to each other in one direction, and a connecting portion at which the branches are connected to each other. The opening of the current spreading layer may be placed on the connecting portion.

The light emitting diode may further include a lower insulation layer placed between the mesa and the current spreading layer and insulating the current spreading layer from the mesa. The lower insulation layer has an opening that is placed in an upper region of the mesa and exposes the reflective electrode structure.

Furthermore, the opening of the current spreading layer may have a greater width than the opening of the lower insulation layer such that the opening of the lower insulation layer is completely exposed therethrough. As a result, the current spreading layer can be insulated from the reflective electrode structure.

On the other hand, the light emitting diode may further include an anti-diffusion reinforcing layer placed within the opening of the current spreading layer and the opening of the lower insulation layer, and the anti-diffusion reinforcing layer may be exposed through the second opening of the upper insulation layer.

In addition, the lower insulation layer may include a silicon oxide layer and the upper insulation layer may include a silicon nitride layer. As the upper insulation layer is formed of silicon nitride, it is possible to prevent diffusion of metal elements from the solder paste through the upper insulation layer.

In some embodiments, the solder paste may include lead-free solder alloys, for example, Sn—Ag alloys, Sn—Bi alloys, Sn—Zn alloys, or Sn—Ag—Cu alloys.

The light emitting diode may further include a substrate and a wavelength conversion layer covering a lower surface of the substrate. The substrate may be a growth substrate for growing the semiconductor layers. In addition, the wavelength conversion layer may cover the lower surface and a side surface of the substrate.

In accordance with yet another aspect of the present invention, a method of fabricating a light emitting diode includes: forming a first conductive-type semiconductor layer, an active layer and a second conductive-type semiconductor layer on a substrate; patterning the second conductive-type semiconductor layer and the active layer to form a mesa on the first conductive-type semiconductor layer while forming a reflective electrode structure on the mesa to form ohmic contact with the mesa; forming a current spreading layer covering the mesa and the first conductive-type semiconductor layer, and having an opening that exposes the reflective electrode structure, the current spreading layer forming ohmic contact with the first conductive-type semiconductor layer while being insulated from the mesa; and forming an upper insulation layer covering the current spreading layer. On the other hand, the upper insulation layer may have a first opening exposing the current spreading layer to define a first electrode pad region, and a second opening exposing an exposed upper region of the reflective electrode structure to define the second electrode pad region.

In the fabrication method, since there is no need for formation of electrode pads on the upper insulation layer, it is possible to reduce the number of photomasks for fabrication of the light emitting diode.

The method may further include forming an anti-diffusion reinforcing layer on the reflective electrode structure. The anti-diffusion reinforcing layer can be formed together with the current spreading layer, and the second opening of the upper insulation layer can expose the anti-diffusion reinforcing layer. Accordingly, the reflective electrode structure can be concealed and protected by the anti-diffusion reinforcing layer and the upper insulation layer.

The method may further include forming a lower insulation layer covering the mesa and the first conductive-type semiconductor layer, before forming the current spreading layer; dividing the lower insulation layer and the first conductive-type semiconductor layer into chip regions by laser scribing; and patterning the lower insulation layer to form openings exposing the first conductive-type semiconductor layer and an opening exposing the reflective electrode structure.

Since a chip isolation region is formed using laser scribing, there is no need for use of a photomask. In addition, since laser scribing is performed after formation of the lower insulation layer, particles formed in the laser scribing process can be easily removed by cleaning the lower insulation layer, whereby the light emitting diode can be prevented from being contaminated by the particles.

The lower insulation layer may include a silicon oxide layer and the upper insulation layer may include a silicon nitride layer.

The method may further include forming an anti-Sn diffusion plating layer on the first electrode pad region and the second electrode pad region using a plating technique. The plating layer may be formed by electroless plating such as ENIG (electroless nickel immersion gold) and the like.

On the other hand, the substrate may be partially removed to have a small thickness by grinding and/or lapping. Then, the substrate is separated from the chip isolation region formed by laser scribing, thereby providing final individual chips separated from each other. Next, a wavelength conversion layer may be coated onto the light emitting diode chips, and the light emitting diode having the wavelength conversion layer is mounted on a printed circuit board via a solder paste, thereby providing an LED module.

The wavelength conversion layer may be formed by coating a phosphor-containing resin, followed by curing the resin. Alternatively, the wavelength conversion layer may be formed by spraying phosphor powder onto the light emitting diode chip using an aerosol apparatus.

According to embodiments of the disclosed technology, it is possible to protect light emitting diodes from static electricity by forming a spark gap. In addition, some implementations of the disclosed technology provide a light emitting diode, which can prevent diffusion of metal elements from a solder paste, and a method for fabricating the same. Further, some implementations of the disclosed technology provide a light emitting diode having improved current spreading performance, for example, a flip-chip type light emitting diode having improved current spreading performance. Furthermore, the light emitting diodes according to some implementations of the disclosed technology have improved reflectivity by forming a current spreading layer, thereby providing improved light extraction efficiency. Furthermore, the light emitting diodes according to some implementations of the disclosed technology can omit a photolithography process for formation of electrode pads, and can reduce the number of photomasks by forming a chip isolation region using a laser scribing technique.

DETAILED DESCRIPTION

Figure 1:
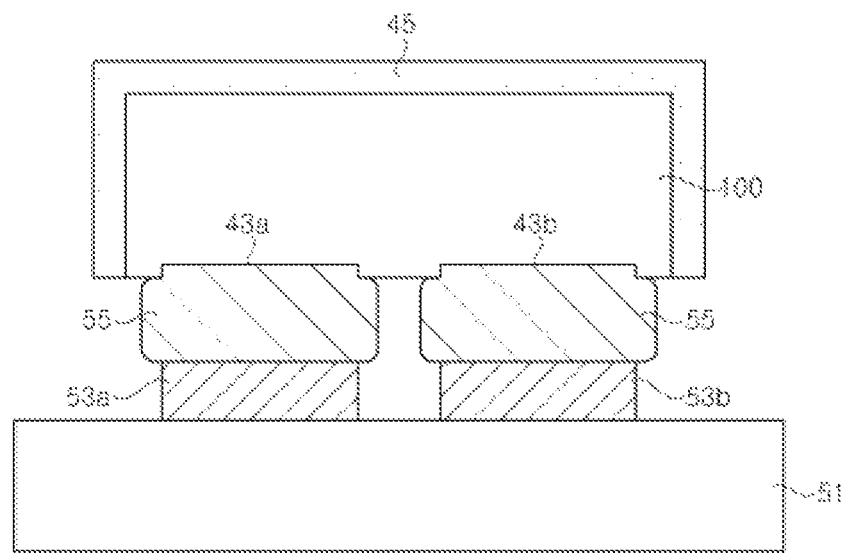
FIG. 1 is a schematic sectional view of an exemplary LED module in accordance with an embodiment of the disclosed technology.

In the related art, the light emitting diode employs linear extension legs which have high resistance, which results in imposing some limit on current spreading. Moreover, since the reflective electrode is placed only on the P-type semiconductor layer, a substantial amount of light is absorbed by the electrode pads and extension legs while not being reflected by the reflective electrode and thus, substantial light loss is caused. When used in a final product, the light emitting diode is provided by an LED module. The LED module generally includes a printed circuit board and an LED package mounted on the printed circuit board, in which the light emitting diode is mounted in chip form within the LED package. A typical LED chip is packaged after being mounted on a sub-mount, a lead frame or a lead electrode by silver pastes or AuSn solders. Then, the LED package is mounted on the printed circuit board by solder pastes. As a result, pads on the LED chip are distant from the solder pastes, and bonded to the printed circuit board by a relatively stable bonding material such as silver pastes, AuSn, and the like.

Recently, various attempts have been made to fabricate an LED module by directly bonding electrode pads of a light emitting diode to a printed circuit board using solder pastes. For example, an LED module can be fabricated by directly mounting an LED chip on a printed circuit board instead of packaging the LED chip. Otherwise, an LED module can be fabricated by mounting a so-called wafer level LED package on a printed circuit board. In these LED modules, since the electrode pads directly adjoin the solder pastes, metal elements such as tin (Sn) diffuse from the solder pastes into the light emitting diode through the pads and cause short circuit in the light emitting diode and device failure.

GaN-based compound semiconductors are formed by epitaxial growth on a sapphire substrate, the crystal structure and lattice parameter of which are similar to those of the semiconductors, in order to reduce crystal defects. However, the epitaxial layers grown on the sapphire substrate contain many crystal defects such as V-pits, threading dislocations, and the like. When high voltage static electricity is applied to the epitaxial layers, current is concentrated at crystal defects in the epitaxial layers, causing diode breakdown. Thus, with respect to electrostatic discharge or electrical fast transient (EFT), which is a spark generated in a switch, and lightning surge in air, securing reliability of LEDs becomes important.

Generally, in packaging of a light emitting diode, a Zener diode is mounted together with the light emitting diode to prevent electrostatic discharge. However, the Zener diode is expensive and a process of mounting the Zener diode increases the number of processes for packaging the light emitting diode and manufacturing costs. Moreover, since the Zener diode is placed near the light emitting diode in the LED package, the LED package has deteriorated luminous efficacy due to absorption of light by the Zener diode and deteriorated LED package yield.

Hereinafter, exemplary embodiments of the disclosed technology will be described in detail with reference to the accompanying drawings. It should be understood that the following embodiments are provided as some examples of the disclosed technology to facilitate understanding of the disclosed technology. Thus, it should be understood that the disclosed technology is not limited to the following embodiments and may be embodied in different ways. In addition, in the drawings, the width, length and thickness of components may be exaggerated for convenience. Further, it should be noted that the drawings are not to precise scale. Like components will be denoted by like reference numerals throughout the specification.

FIG. 1 is a schematic sectional view of an LED module in accordance with one embodiment of the disclosed technology.

Referring to FIG. 1, an LED module according to an exemplary embodiment of the disclosed technology includes a printed circuit board 51 having pads 53a and 53b and a light emitting diode 100 bonded to the printed circuit board 51 via solder pastes 55.

The printed circuit board has a printed circuit thereon, and any substrate capable of providing an LED module can be used as the printed circuit board without limitation.

Conventionally, a light emitting diode is mounted on a substrate having a lead frame or lead electrodes formed thereon, and a light emitting diode package including such a light emitting diode is mounted on a printed circuit board. According to some implementations, the light emitting diode 100 is directly mounted on the printed circuit board 51 via the solder pastes 55.

The light emitting diode 100 may include a flip-chip type light emitting diode and be mounted upside down on the printed circuit board. To this end, the light emitting diode 100 has a first electrode pad region 43a and a second electrode pad region 43b. The first and second electrode pad regions 43a and 43b may be formed in a recess shape on one surface of the light emitting diode 100.

On the other hand, a lower surface of the light emitting diode 100, for example, a surface of the light emitting diode opposite the first and second electrode pad regions 43a and 43b, may be covered with a wavelength conversion layer 45. The wavelength conversion layer 45 may cover not only the lower surface of the light emitting diode 100 but also side surfaces of the light emitting diode 100.

In FIG. 1, the light emitting diode is schematically shown for convenience of description. The structure and respective components of the light emitting diode will be more clearly understood in the following description of a method of fabricating the light emitting diode. Furthermore, it should be noted that light emitting diodes according to embodiments of the disclosed technology are not limited to the structure in which the light emitting diode is directly mounted on the printed circuit board.

FIG. 2(a) to FIG. 10 are views illustrating a method of fabricating a light emitting diode in accordance with an exemplary embodiment of the disclosed technology. In each feature, (a) is a plan view, (b) is a cross-sectional view taken along line A-A, and (c) is a cross-sectional view taken along line B-B.

Figure 2A:
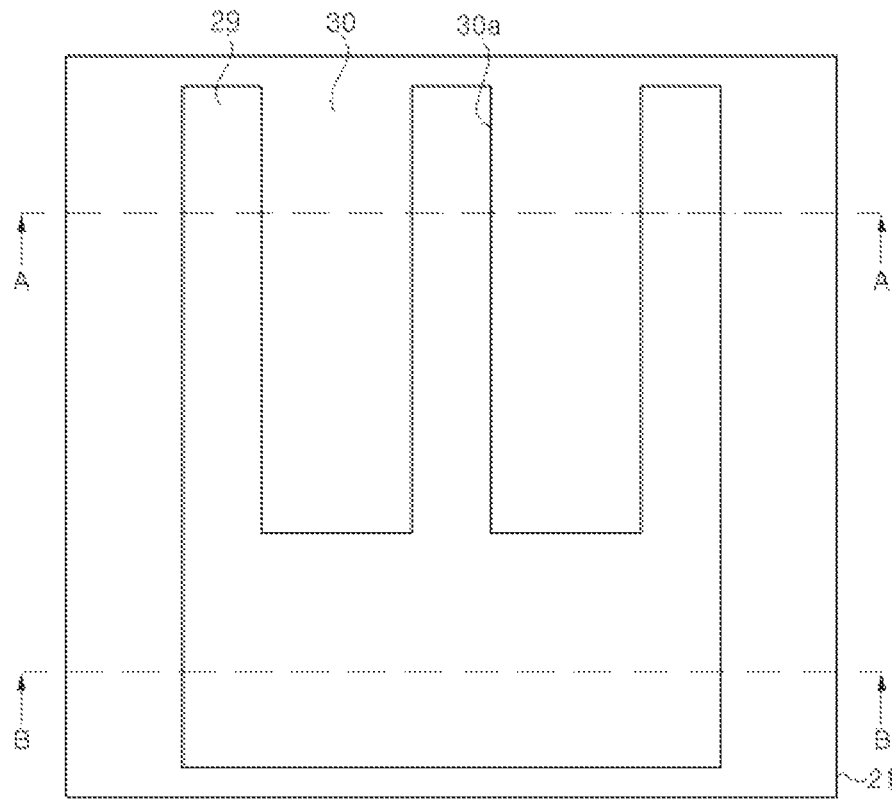
FIG. 2(a) to FIG. 10 are views illustrating an exemplary method of fabricating a light emitting diode in accordance with an embodiment of the disclosed technology, and in each of FIG. 2 to FIG. 9, (a) is a plan view, (b) is a cross-sectional view taken along line A-A, and (c) is a cross-sectional view taken along line B-B.
Figure 2B:
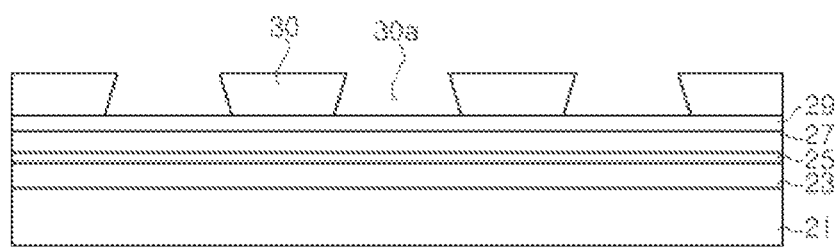
Figure 2C:
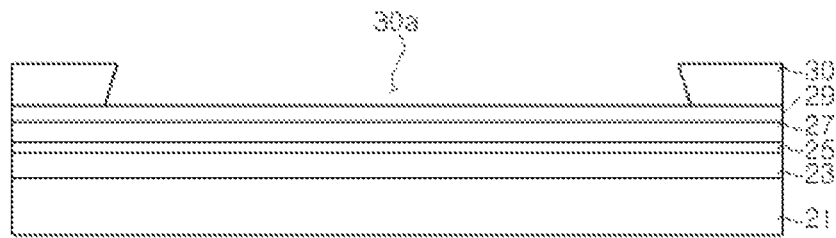

First, referring to FIGS. 2(a) to 2(c), a first conductive-type semiconductor layer 23, an active layer 25 and a second conductive-type semiconductor layer 27 are grown on a substrate 21. The substrate 100 enables the growth of a GaN-based semiconductor layer, and may include, for example, a sapphire substrate, a silicon carbide substrate, a GaN substrate, or a spinel substrate, and the like. In some implementations, the substrate may be or include a patterned substrate such as a patterned sapphire substrate.

For example, the first conductive-type semiconductor layer may include an n-type gallium nitride-based layer and the second conductive-type semiconductor layer 27 may include a p-type gallium nitride-based layer. In addition, the active layer 25 may have a single quantum well structure or a multi-quantum well structure, and may include well layers and barrier layers. In addition, the composition of the well layers may be determined according to the wavelength of light and may include, for example, AlGaN, GaN or InGaN.

On the other hand, a pre-oxidation layer 29 may be formed on the second conductive-type semiconductor layer 27. The pre-oxidation layer 29 may be formed of or include, for example, $SiO_2$ by chemical vapor deposition.

Then, a photoresist pattern 30 is formed. The photoresist pattern 30 is patterned to have openings 30a. As shown in FIG. 2(a) and FIG. 2(b), the openings 30a are formed such that an inlet of each opening has a narrower width than a bottom of the opening. The photoresist pattern 30 having the openings 30a of this structure can be easily formed using a negative type photoresist.

Figure 3A:
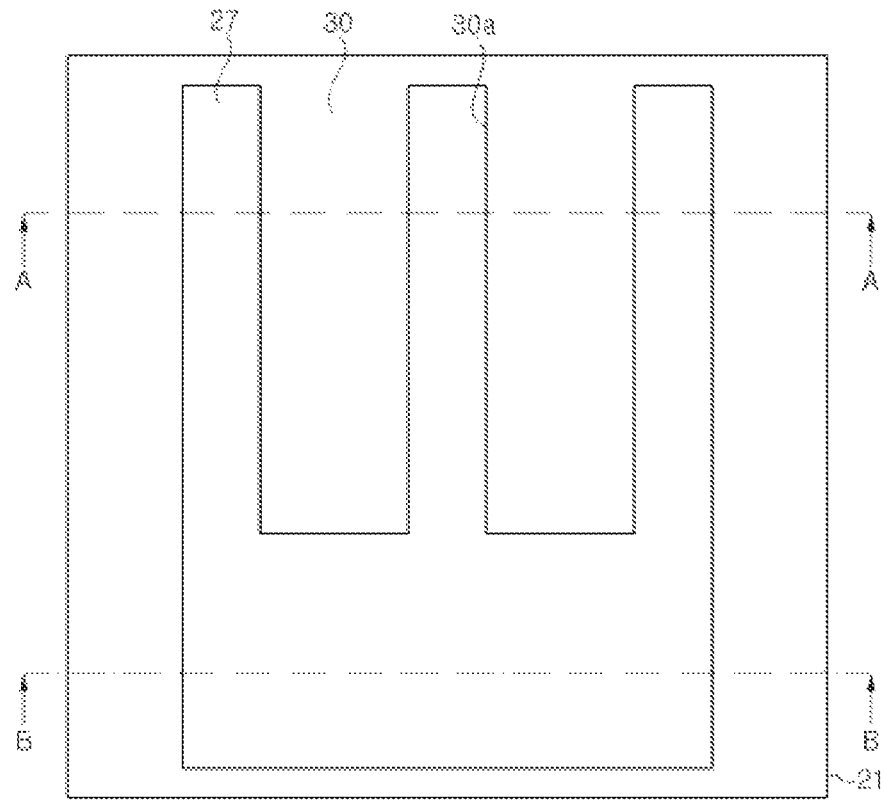
Figure 3B:
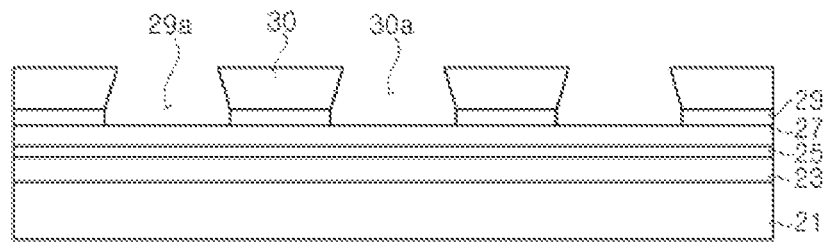
Figure 3C:
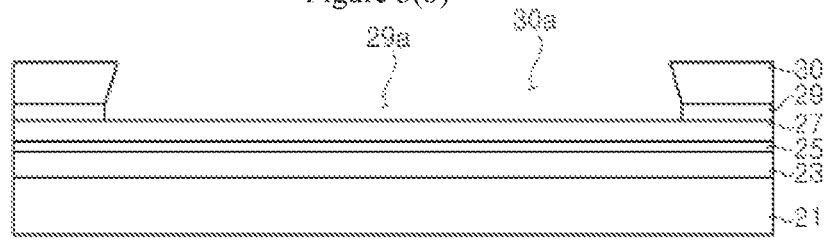

Referring to FIGS. 3(a) to 3(c), the pre-oxidation layer 29 is etched using the photoresist pattern 30 as an etching mask. The pre-oxidation layer 29 may be etched by wet etching. As a result, the pre-oxidation layer 29 in the openings 30a of the photoresist pattern 30 is etched to form openings 29a of the pre-oxidation layer 29, which expose the second conductive-type semiconductor layer 27. The bottom portions of the openings 29a are generally similar or greater than the bottom portions of the openings 30a of the photoresist pattern 30.

Figure 4A:
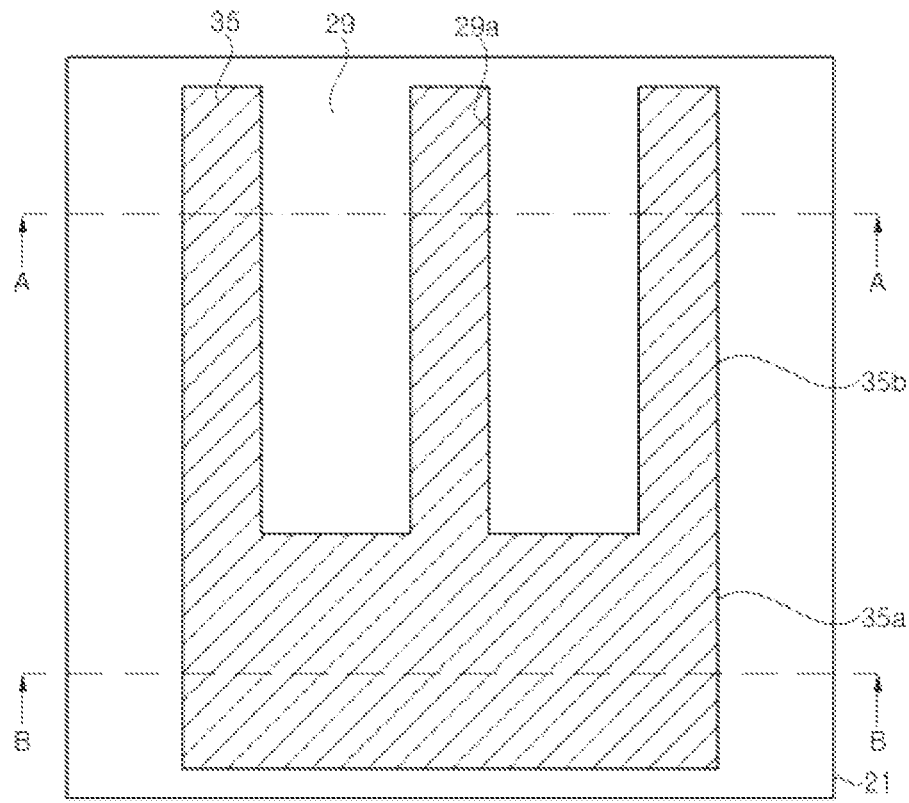
Figure 4B:
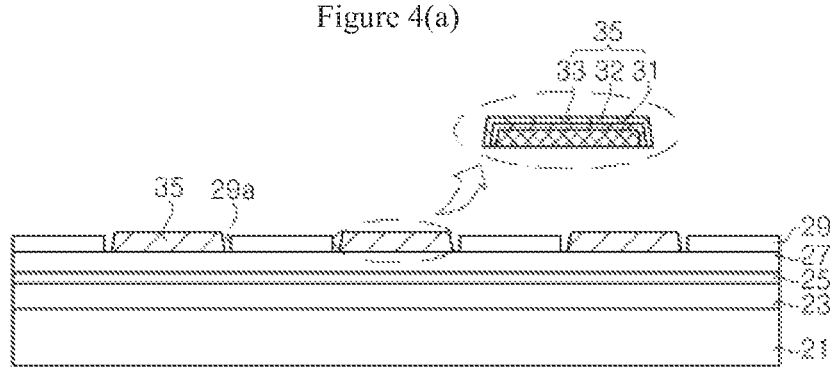
Figure 4C:
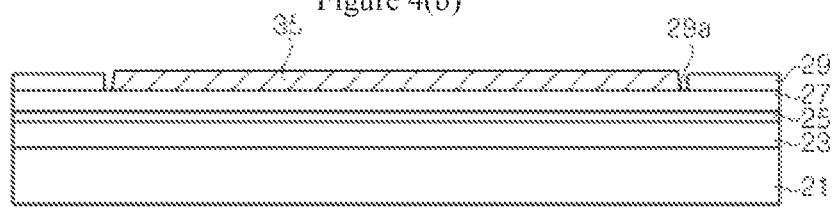

Referring to FIG. 4, a reflective electrode structure 35 is formed by a lift-off technology. The reflective electrode structure 35 may include a reflective metal section 31, a capping metal section 32 and an anti-oxidation metal section 33. The reflective metal section 31 includes a reflective layer, and a stress relief layer may be further formed between the reflective metal section 31 and the capping metal section 32. The stress relief layer relieves stress due to difference in coefficient of thermal expansion between the reflective metal section 31 and the capping metal section 32.

The reflective metal section 31 may be formed of or include, for example, Ni/Ag/Ni/Au, and may have an overall thickness of about 1600 Å. As shown, the reflective metal section 31 is formed to have a slanted side surface, for example, such that the bottom of the reflective metal section has a relatively wide area. Such a reflective metal section 31 may be formed by e-beam evaporation.

The capping metal section 32 covers upper and side surfaces of the reflective metal section 31 to protect the reflective metal section 31. The capping metal section 32 may be formed by sputtering or by e-beam evaporation, for example, planetary e-beam evaporation, in which vacuum deposition is performed while rotating the substrate 21 in a slanted state. The capping metal section 32 may include Ni, Pt, Ti, or Cr, and may be formed by depositing, for example, about five pairs of Ni/Pt layers or about five pairs of Ni/Ti layers. Alternatively, the capping metal section 32 may include TiW, W, or Mo.

A material for the stress relief layer may be selected in various ways depending upon metal components of the reflective layer and the capping metal section 32. For example, when the reflective layer is composed of or includes Al or Al-alloys and the capping metal section 32 is composed of or includes W, TiW or Mo, the stress relief layer may be or include a single layer of Ag, Cu, Ni, Pt, Ti, Rh, Pd or Cr, or a composite layer of Cu, Ni, Pt, Ti, Rh, Pd or Au. In addition, when the reflective layer is composed of or includes Al or Al-alloys and the capping metal section 32 is composed of or includes Cr, Pt, Rh, Pd or Ni, the stress relief layer may be or include a single layer of Ag or Cu, or a composite layer of Ni, Au, Cu or Ag.

In addition, when the reflective layer is composed of or includes Ag or Ag-alloys and the capping metal section 32 is composed of or includes W, TiW or Mo, the stress relief layer may be or include a single layer of Cu, Ni, Pt, Ti, Rh, Pd or Cr, or a composite layer of Cu, Ni, Pt, Ti, Rh, Pd, Cr or Au. Further, when the reflective layer is composed of or includes Ag or Ag-alloys and the capping metal section 32 is composed of or includes Cr or Ni, the stress relief layer may be or include a single layer of Cu, Cr, Rh, Pd, TiW or Ti, or a composite layer of Ni, Au or Cu.

Further, the anti-oxidation metal section 33 includes Au in order to prevent oxidation of the capping metal section 32, and may be formed of or include, for example, Au/Ni or Au/Ti. Since Ti secures adhesion of an oxide layer such as $SiO_2$, in some implementations, Ti can be used. The anti-oxidation metal section 33 may also be formed by sputtering or by e-beam evaporation, for example, planetary e-beam evaporation, in which vacuum deposition is performed while rotating the substrate 21 in a slanted state.

The photoresist pattern 30 is removed after deposition of the reflective electrode structure 35, whereby the reflective electrode structure 35 remains on the second conductive-type semiconductor layer 27, as shown in FIG. 4.

The reflective electrode structure 35 may include branches 35b and a connecting portion 35a, as shown in FIG. 4. The branches 35b may have an elongated shape and be parallel to each other. The connecting portion 35a connects the branches 35b to each other. However, it should be understood that the reflective electrode structure 35 is not limited to a particular shape and may be modified into various shapes.

Figure 5A:
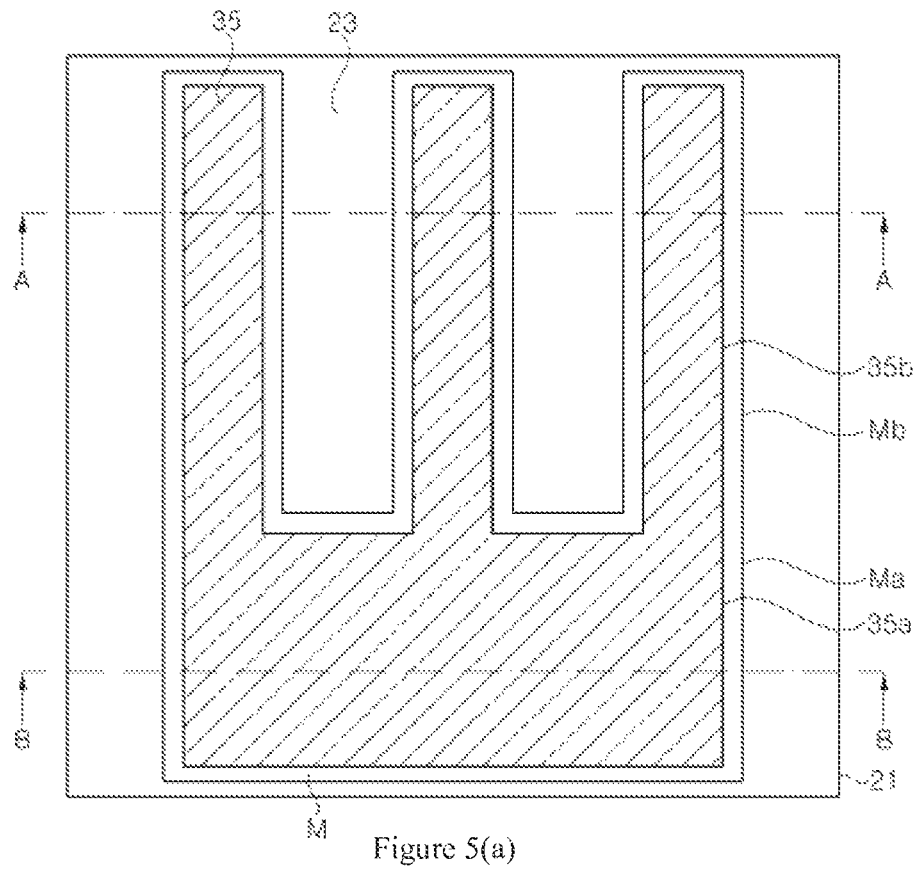
Figure 5B:
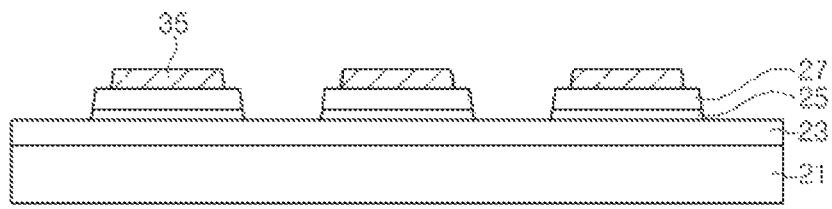
Figure 5C:
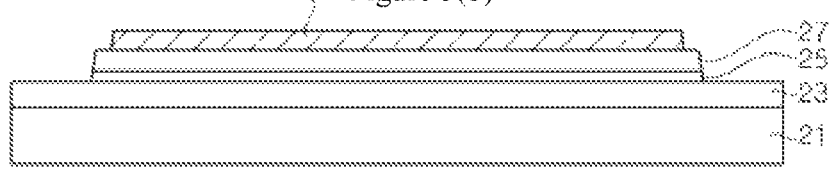

Referring to FIG. 5, a mesa M is formed on the first conductive-type semiconductor layer 21. The mesa M includes the active layer 25 and the second conductive-type semiconductor layer 27. The active layer 25 is placed between the first conductive-type semiconductor layer 23 and the second conductive-type semiconductor layer 27. The reflective electrode structure 35 is placed on the mesa M.

The mesa M is formed by patterning the second conductive-type semiconductor layer 27 and the active layer 25 so as to expose the first conductive-type semiconductor layer 23. The mesa M may be formed to have a slanted side surface by photoresist reflow technology or the like. The slanted profile of the side surface of the mesa M enhances extraction efficiency of light generated in the active layer 25.

As shown, the mesa M may include elongated branches Mb extending parallel to each other in one direction and a connection portion Ma connecting the branches to each other. With such configuration of the mesa, the light emitting diode can permit uniform spreading of electric current in the first conductive-type semiconductor layer 23. Here, it should be understood that the mesa M is not limited to a particular shape and may be modified into various shapes. On the other hand, the reflective electrode structure 35 covers most of the upper surface of the mesa M and generally has the same shape as the shape of the mesa M in plan view.

While the second conductive-type semiconductor layer 27 and the active layer 25 are subjected to etching, the pre-oxidation layer 29 remaining on these layers is also partially removed by etching. On the other hand, although the pre-oxidation layer 29 can remain near an edge of the reflective electrode structure 35 on each of the mesa M, the remaining pre-oxidation layer 29 can also be removed by wet etching and the like. Alternatively, the pre-oxidation layer 29 may be removed before formation of the mesa M.

Figure 6A:
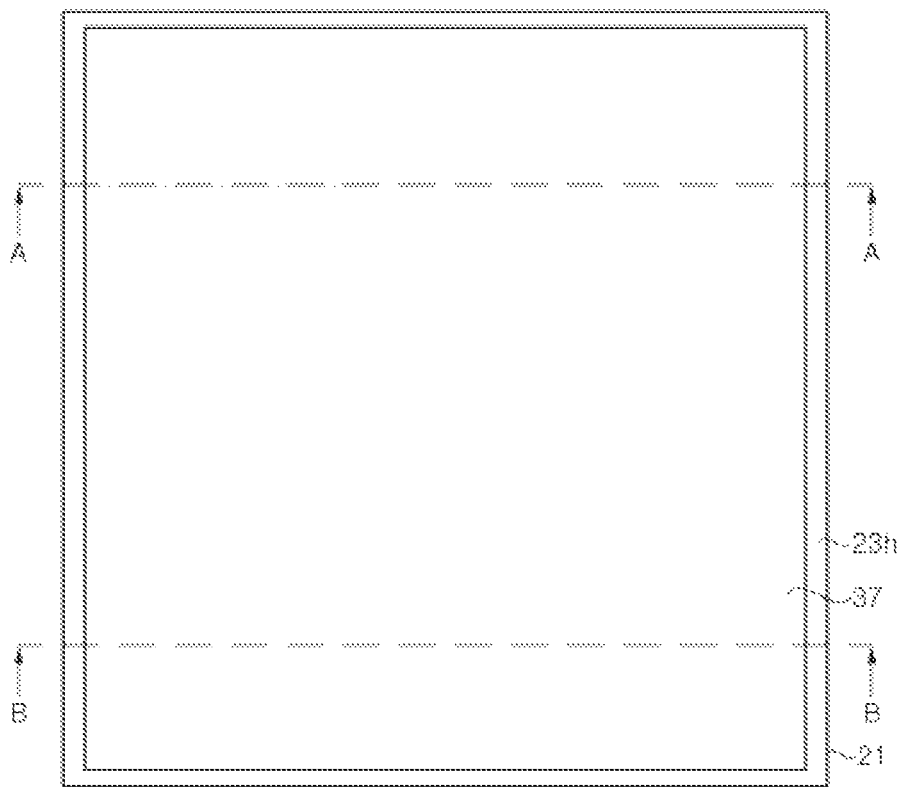
Figure 6B:
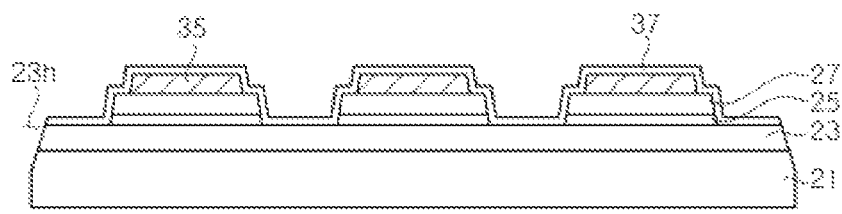
Figure 6C:
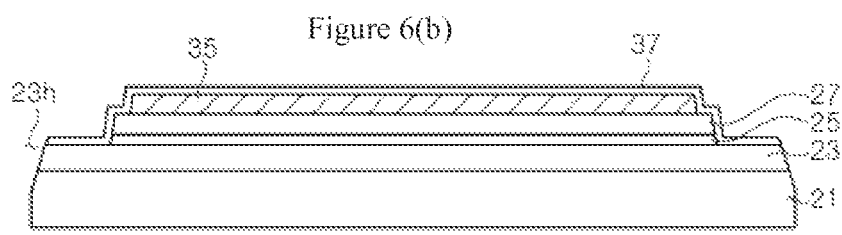

Referring to FIG. 6, after the mesa M is formed, a lower insulation layer 37 is formed to cover the mesa M and the first conductive-type semiconductor layer. The lower insulation layer 37 may be formed of or include an oxide layer such as $SiO_2$ and the like, a nitride layer such as SiNx and the like, or an insulation layer of $MgF_2$ by chemical vapor deposition (CVD) and the like. The lower insulation layer 37 may be a single layer or multiple layers. In addition, the lower insulation layer 37 may be or include a distributed Bragg reflector (DBR) in which low refractive index material layers and high refractive index material layers are alternately stacked one above another. For example, an insulating reflective layer having high reflectivity may be formed by stacking dielectric layers such as $SiO_2/TiO_2$, or $SiO_2/Nb_2O_5$, and the like.

Then, a chip isolation region 23h is formed by laser scribing to divide the lower insulation layer 37 and the first conductive-type semiconductor layer 23 into chip units. Grooves may be formed on the upper surface of the substrate 21 by laser scribing. As a result, the substrate 21 is exposed near an edge of the first conductive-type semiconductor layer 23.

Since the first conductive-type semiconductor layer 23 is divided into chip units by laser scribing, it is possible to omit a separate photomask for an isolation process. However, it should be understood that the disclosed technology is not limited to the isolation process using laser scribing. For example, the first conductive-type semiconductor layer 23 may be divided into chip units before or after formation of the lower insulation layer 37 using a typical photolithography and etching technique.

As shown in FIG. 6, the mesa M may be formed to be placed only inside an upper region of the first conductive-type semiconductor layer 23. For example, the mesa M may be placed in an island shape on the upper region of the first conductive-type semiconductor layer 23.

Figure 7A:
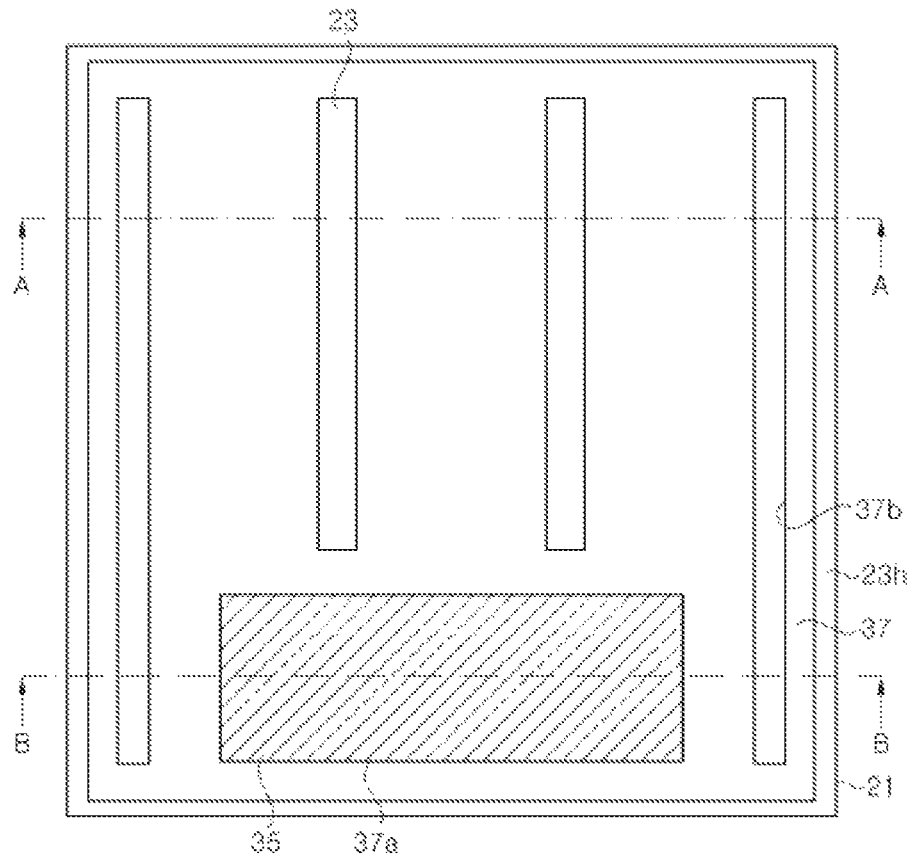
Figure 7B:
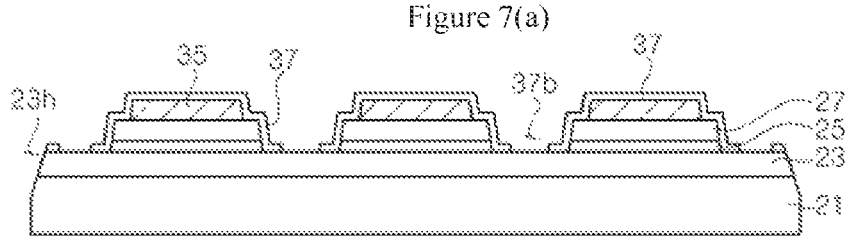
Figure 7C:
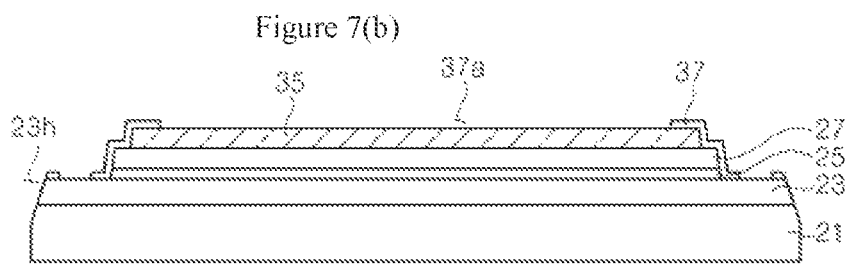

Next, referring to FIG. 7, the lower insulation layer 37 is subjected to patterning to form openings 37a and 37b in predetermined regions to allow electrical connection to the first conductive-type semiconductor layer 23 and the second conductive-type semiconductor layer 27. For example, the lower insulation layer 37 may have openings 37b which expose the first conductive-type semiconductor layer 23, and openings 37a which expose the reflective electrode structure 35.

The openings 37a are placed only in upper regions of the mesas M, for example, on the connecting portions of the mesas M. The openings 37b may be placed in regions between the branches Mb of the mesas M and near the edge of the substrate 21, and may have an elongated shape extending along the branches Mb of the mesas M.

Figure 8A:
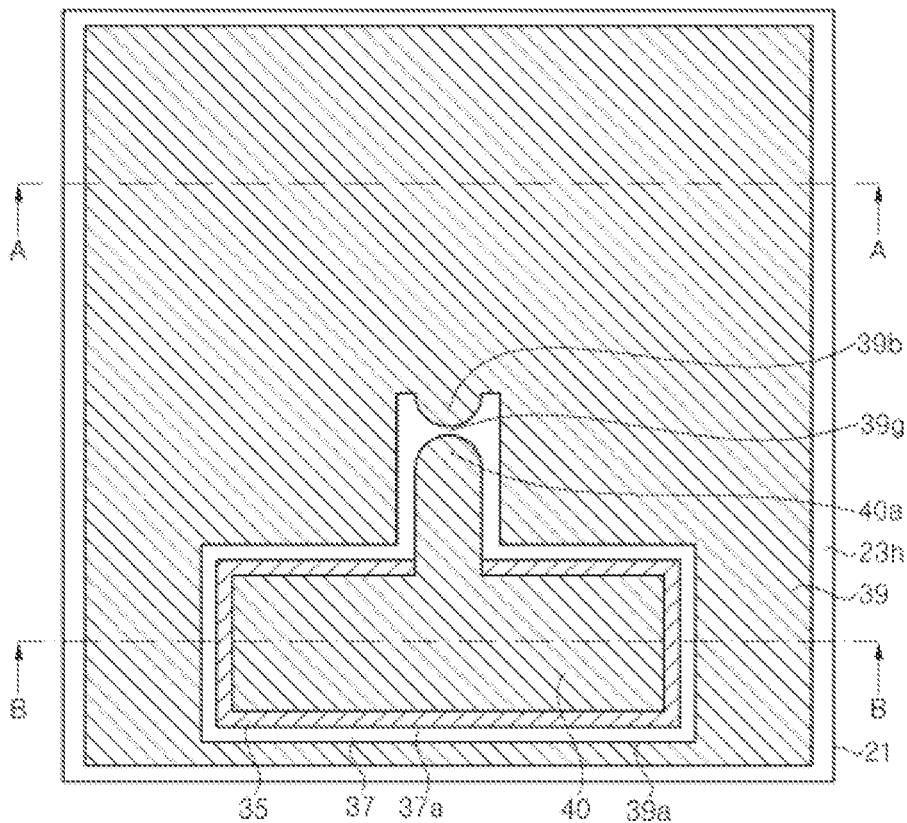
Figure 8B:
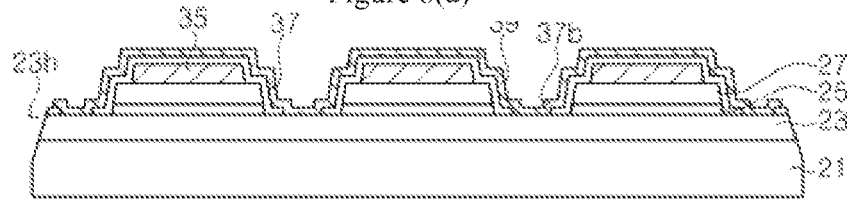
Figure 8C:
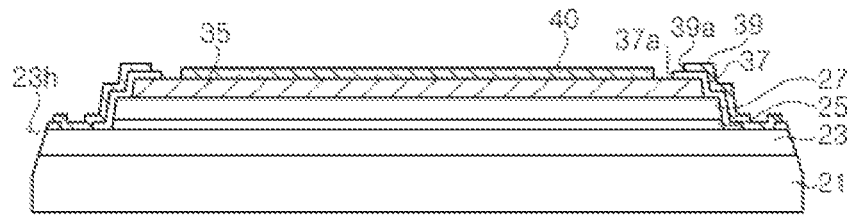

Referring to FIG. 8, a current spreading layer 39 is formed on the lower insulation layer 37. The current spreading layer 39 covers the mesa M and the first conductive-type semiconductor layer 23. In addition, the current spreading layer 39 has an opening 39a placed in the upper region of the mesa M and exposing the reflective electrode structure 35. The current spreading layer 39 may form ohmic contact with the first conductive-type semiconductor layer 23 through the opening 37b of the lower insulation layer 37. The current spreading layer 39 is insulated from the mesa M and the reflective electrodes 35 by the lower insulation layer 37.

The opening 39a of the current spreading layer 39 has a greater area than the opening 37a of the lower insulation layer 37 to prevent the current spreading layer 39 from being connected to the reflective electrode structures 35. Thus, the opening 39a has sidewalls placed on the lower insulation layer 37.

The current spreading layer 39 is formed on an overall upper region of the substrate 21 excluding the openings 39a. Thus, electric current can be easily dispersed through the current spreading layer 39.

The current spreading layer 39 may include an ohmic contact layer, a reflective metal layer, an anti-diffusion layer, and an anti-oxidation layer. The current spreading layer can form ohmic contact with the first conductive-type semiconductor layer through the ohmic contact layer. For example, the ohmic contact layer may be formed of or include Ti, Cr, or Ni, and the like. The reflective metal layer increases reflectivity of the light emitting diode by reflecting incident light entering the current spreading layer. The reflective metal layer may be formed of or include Al. In addition, the anti-diffusion layer protects the reflective metal layer by preventing diffusion of metal elements. For example, the anti-diffusion layer can prevent diffusion of metal elements such as Sn within a solder paste. The anti-diffusion layer may be composed of or include Cr, Ti, Ni, Mo, TiW, or W or combinations thereof. The anti-diffusion layer may be a single layer including Mo, TiW or W. Alternatively, the anti-diffusion layer may include a pair of Cr, Ti or Ni layers. For example, the anti-diffusion layer may include at least two pairs of Ti/Ni or Ti/Cr layers. The anti-oxidation layer is formed to prevent oxidation of the anti-diffusion layer and may include Au.

The current spreading layer may have a reflectivity of 65% to 75%. Accordingly, the light emitting diode according to this embodiment can provide optical reflection by the current spreading layer in addition to optical reflection by the reflective electrode structure, whereby light traveling through the sidewall of the mesa and the first conductive-type semiconductor layer can be reflected.

The current spreading layer may further include a bonding layer placed on the anti-oxidation layer. The bonding layer may include Ti, Cr, Ni or Ta. The bonding layer is used to enhance bonding strength between the current spreading layer and the upper insulation layer, and may be omitted.

For example, the current spreading layer 39 may have a multi-layer structure including Cr/Al/Ni/Ti/Ni/Ti/Au/Ti.

While the current spreading layer 39 is formed, an anti-diffusion reinforcing layer 40 is formed on the reflective electrode structure 35. The anti-diffusion reinforcing layer 40 and the current spreading layer 39 may be formed of or include the same material by the same process. The anti-diffusion reinforcing layer 40 is separated from the current spreading layer 39. The anti-diffusion reinforcing layer 40 is placed within the opening 39a of the current spreading layer 39.

The anti-diffusion reinforcing layer 40 has a leading end 40a extending therefrom, and the current spreading layer 39 has a leading end 39b facing the leading end 40a. The leading end 40a may be placed on the lower insulation layer 37 outside the opening 37a of the lower insulation layer 37. However, it should be understood that the disclosed technology is not limited thereto. Alternatively, the opening 37a of the lower insulation layer 37 may have a similar shape to the shape of the leading end 40a, and the leading end 40a may be placed within the opening 40a of the lower insulation layer 37.

The leading end 39a of the current spreading layer 39 is placed on the lower insulation layer 37 and is separated from the leading end 40a. The leading end 39b and the leading end 40a define a spark gap therebetween. As a result, these leading ends 39b and 40a may be placed closer than other portions or may have an angled shape in order to allow generation of an electric spark between the leading ends 39b and 40a when high voltage static electricity is applied to a gap between the current spreading layer 39 and the anti-diffusion reinforcing layer 40. For example, as shown in FIG. 8, the leading ends 39b and 40a may have a semi-circular shape or an angled shape and may be disposed to face each other.

Figure 9A:
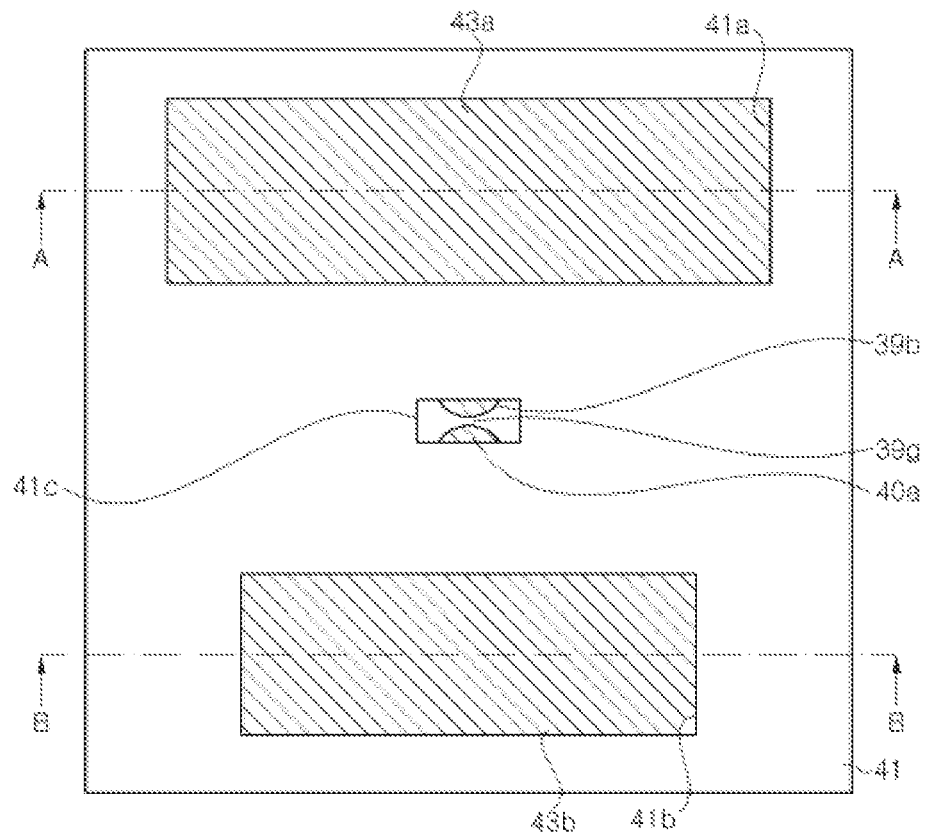
Figure 9B:
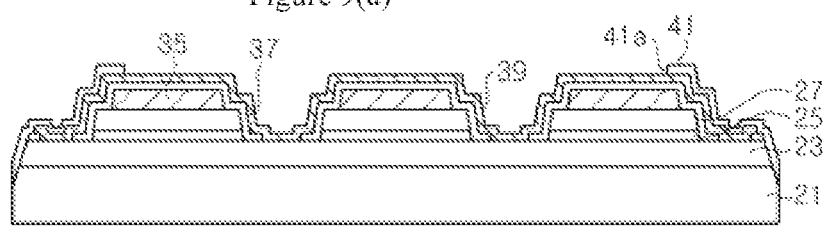
Figure 9C:
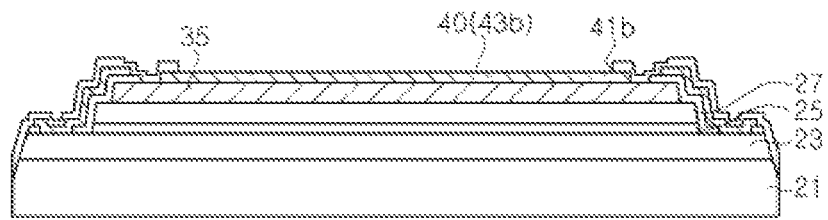

Referring to FIG. 9, an upper insulation layer 41 is formed on the current spreading layer 39. The upper insulation layer 41 has an opening 41a which exposes the current spreading layer 39 to define a first electrode pad region 43a, and an opening 41b which exposes the reflective electrode structure 35 to define a second electrode pad region 43a. The opening 41a may have an elongated shape perpendicular to the branches Mb of the mesa M. The opening 41b of the upper insulation layer 41 has a narrower area than the opening 39a of the current spreading layer 39 and thus the upper insulation layer 41 can cover the sidewall of the opening 39a.

When the anti-diffusion reinforcing layer 40 is formed on the reflective electrode structure 35, the opening 41b exposes the anti-diffusion reinforcing layer 40. In this case, the reflective electrode structure 35 can be concealed or sealed by the upper insulation layer 41 and the anti-diffusion reinforcing layer 40. Furthermore, the upper insulation layer 41 has an opening 41c which exposes at least part of the leading end 39b and the leading end 40a. With this configuration, the spark gap between the leading end 39b and the leading end 40a is exposed, thereby allowing generation of electrostatic discharge by an electrical spark through air.

Further, the upper insulation layer 41 may be formed on the chip isolation region 23h to cover the side surface of the first conductive-type semiconductor layer 23. With this configuration, it is possible to prevent penetration of moisture and the like through upper and lower interfaces of the first conductive-type semiconductor layer.

The upper insulation layer 41 may be formed of or include a silicon nitride layer to prevent diffusion of metal elements from solder pastes, and may have a thickness of 1 m to 2 m. When the thickness of the upper insulation layer is less than 1 m, it is difficult to prevent diffusion of metal the elements from the solder pastes.

Optionally, an anti-Sn diffusion plating layer (not shown) may be additionally formed on the first electrode pad region 43a and the second electrode pad region 43b by electroless plating such as ENIG (electroless nickel immersion gold) and the like.

The first electrode pad region 43a is electrically connected to the first conductive-type semiconductor layer 23 through the current spreading layer 39, and the second electrode pad region 43b is electrically connected to the second conductive-type semiconductor layer 27 through the anti-diffusion reinforcing layer 40 and the reflective electrode structure 35.

The first electrode pad region 43a and the second electrode pad region 43b are used to mount the light emitting diode on a printed circuit board and the like via solder pastes. Thus, in order to prevent short circuit between the first electrode pad region 43a and the second electrode pad region 43b by the solder pastes, electrode pads may be separated by a distance of about 300 m or more from each other.

Then, the substrate 21 may be removed to have a small thickness by partially grinding and/or lapping a lower surface of the substrate 21. Then, the substrate 21 is divided into individual chip units, thereby providing divided light emitting diode chips. Here, the substrate 21 may be divided at the chip isolation region 23h formed by laser scribing and thus there is no need for additional laser scribing for division of chips.

The substrate 21 may be removed from the light emitting diode chips before or after being divided into individual light emitting diode chip units.

Figure 10:
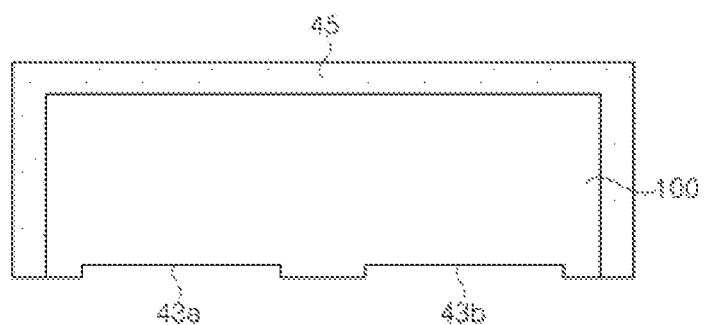

Referring to FIG. 10, a wavelength conversion layer 45 is formed on the light emitting diodes separated from each other. The wavelength conversion layer 45 may be formed by coating a phosphor-containing resin onto the light emitting diodes using a printing technique, or by coating the substrate 21 with phosphor powder using an aerosol apparatus. For example, aerosol deposition can form a thin phosphor layer with a uniform thickness on the light emitting diodes, thereby improving color uniformity of light emitted from the light emitting diodes. As a result, the light emitting diodes according to the embodiments of the disclosed technology are completed and may be bonded to the corresponding pads 53a, 53b of the printed circuit board 51 by solder pastes, as shown in FIG. 1.

In this embodiment, the first and second electrode pad regions 43a and 43b exposed by the upper insulation layer 41 are directly mounted on the printed circuit board. However, it should be understood that the disclosed technology is not limited thereto. Alternatively, additional electrode patterns are formed on the electrode pad regions 43a and 43b to form further enlarged pad regions. In this case, however, an additional photomask for formation of the electrode patterns may be used.

FIG. 11(a) to FIG. 14(c) are views illustrating a method of fabricating a light emitting diode in accordance with another embodiment of the disclosed technology, and in each figure, (a) is a plan view, (b) is a cross-sectional view taken along line A-A, and (c) is a cross-sectional view taken along line B-B.

In the embodiments described above, the mesa M is formed after the reflective electrode structure 35 is formed. In the present implementations, the mesa M is formed before the reflective electrode structure 35 is formed.

Figure 11A:
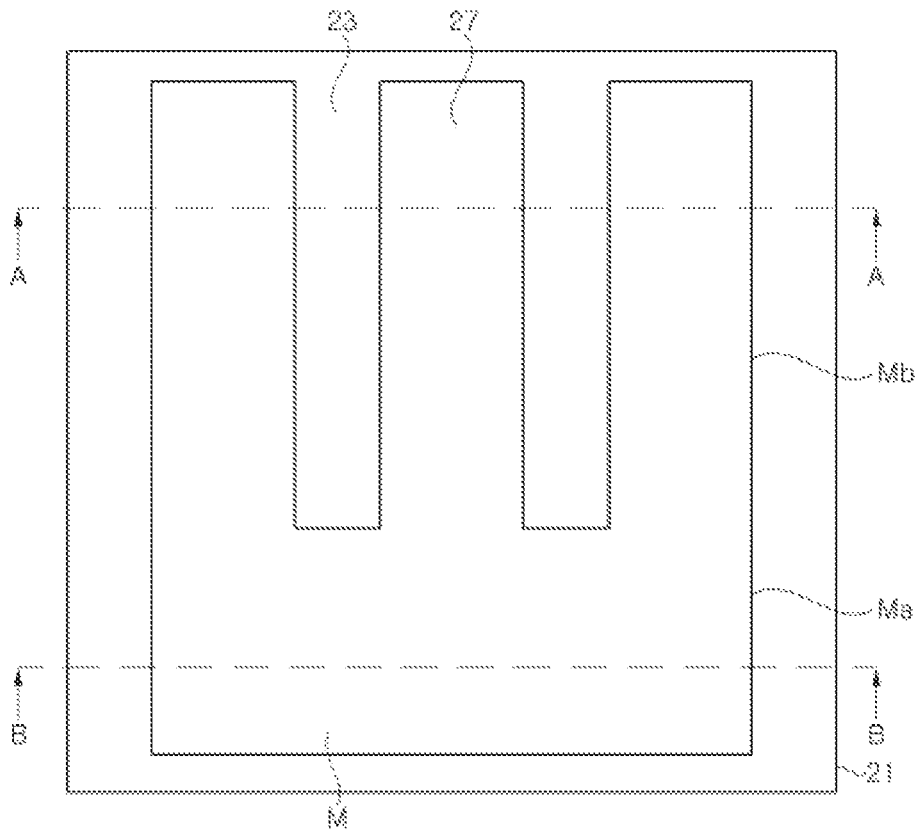
FIG. 11(a) to FIG. 14(c) are views illustrating an exemplary method of fabricating a light emitting diode in accordance with an embodiment of the disclosed technology, and in each of FIG. 11 to FIG. 14, (a) is a plan view, (b) is a cross-sectional view taken along line A-A, and (c) is a cross-sectional view taken along line B-B.
Figure 11B:
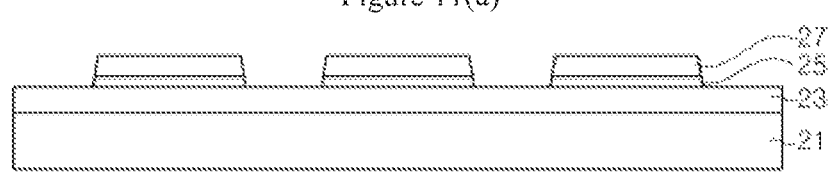
Figure 11C:
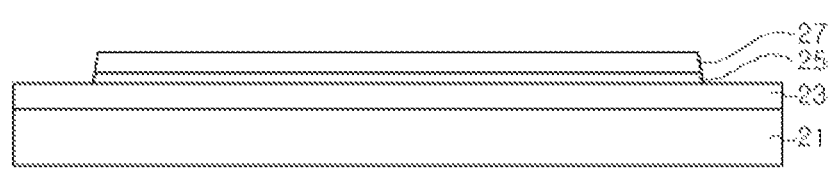

First, referring to FIG. 11, as described with reference to FIG. 2, a first conductive-type semiconductor layer 23, an active layer 25 and a second conductive-type semiconductor layer 27 are formed on a substrate 21. Then, the mesa M is formed by a patterning process. The mesa M is similar to that described above in FIG. 5, and a detailed description thereof will be omitted.

Figure 12A:
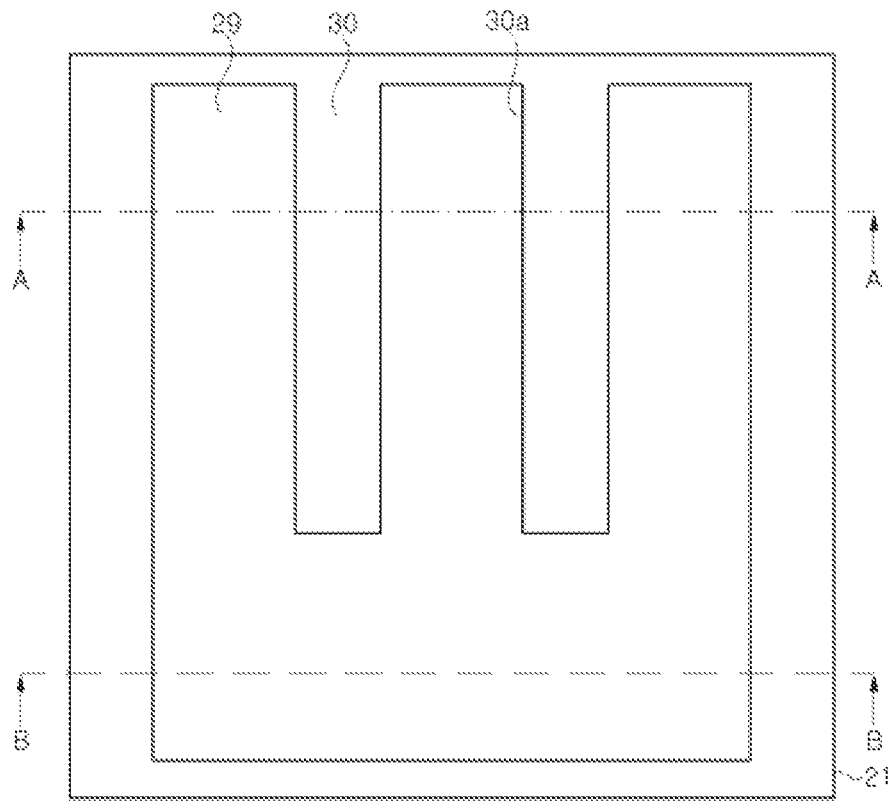
Figure 12B:
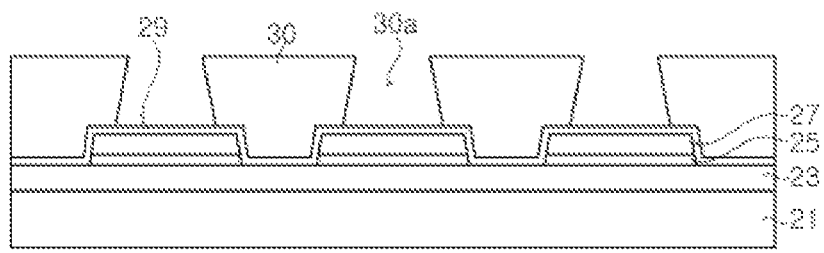
Figure 12C:
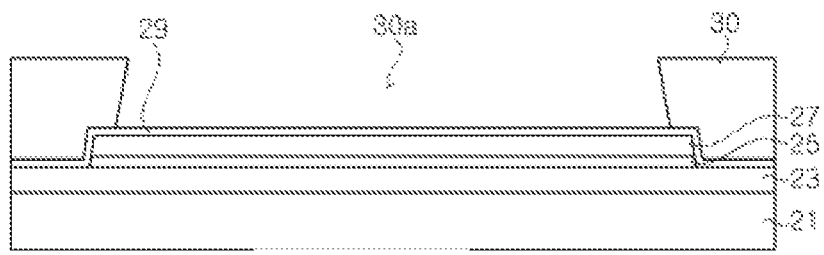

Referring to FIG. 12, a pre-oxidation layer 29 is formed to cover the first conductive-type semiconductor layer 23 and the mesa M. The pre-oxidation layer 29 may be formed of or include the same material by the same process as those described with reference to FIG. 2. A photoresist pattern 30 having openings 30a is formed on the pre-oxidation layer 29. The openings 30a of the photoresist pattern 30 are placed in an upper region of the mesa M. The photoresist pattern 30 is the same as that described with reference to FIG. 2 except that the photoresist pattern 30 is formed on the substrate 21 having the mesa M formed thereon, and a detailed description thereof will be omitted.

Figure 13A:
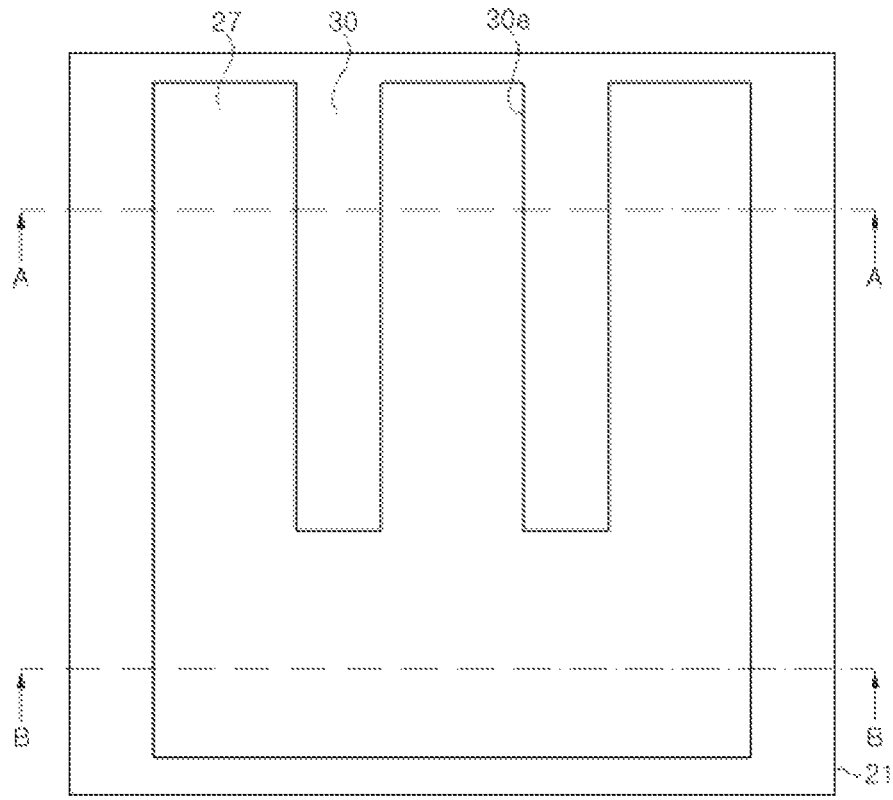
Figure 13B:
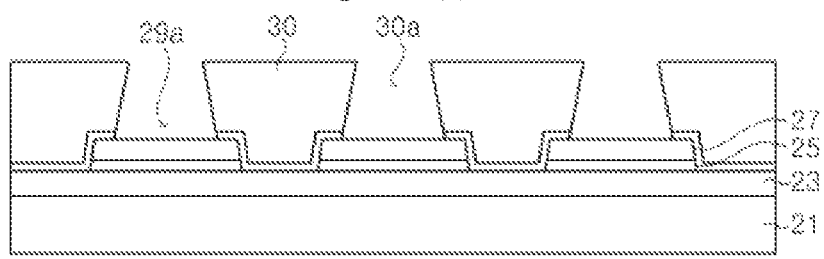
Figure 13C:
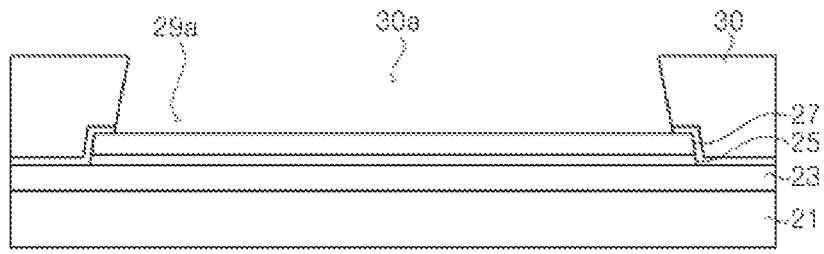

Referring to FIG. 13, the pre-oxidation layer 29 is subjected to etching through the photoresist pattern 30 used as an etching mask, so that openings 29a are formed to expose the second conductive-type semiconductor layer 27 therethrough.

Figure 14A:
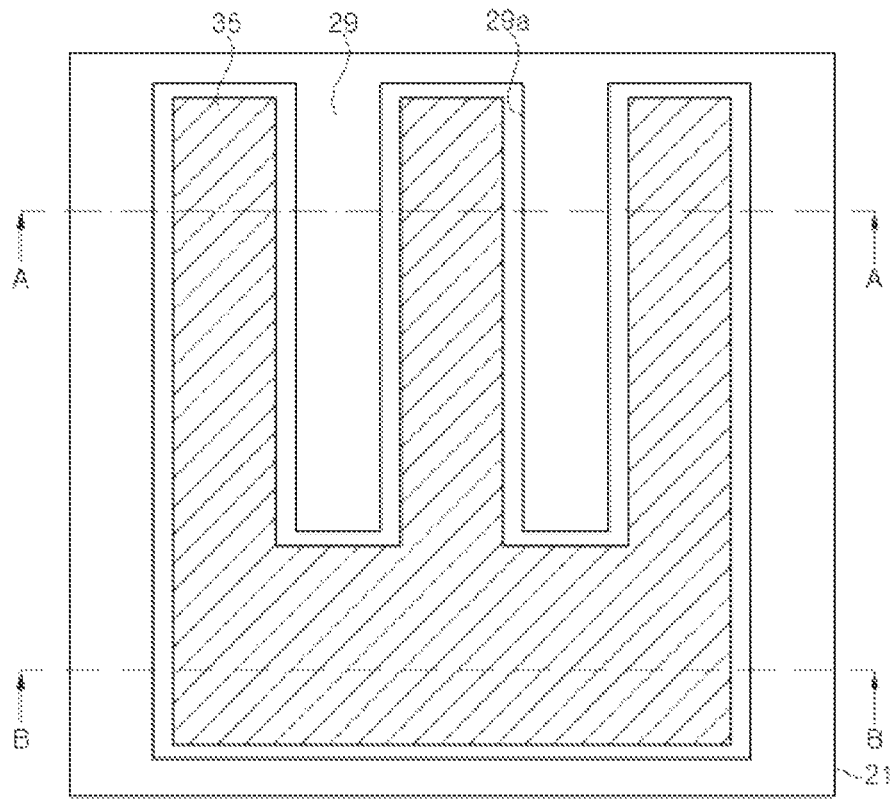
Figure 14B:
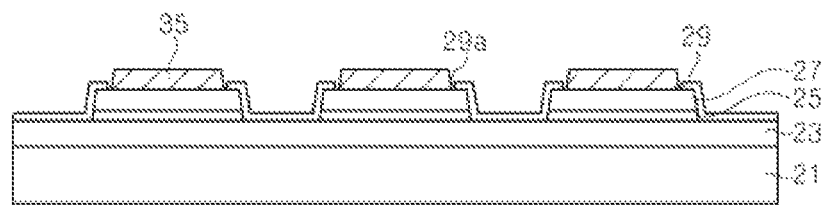
Figure 14C:
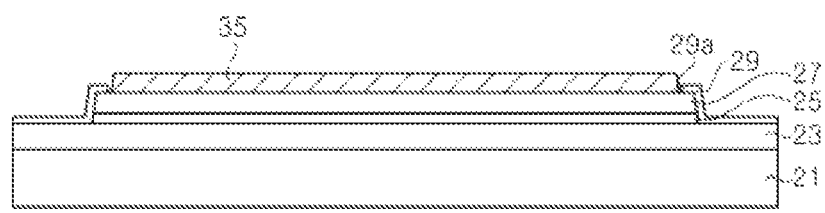

Referring to FIG. 14, as described in detail with reference to FIG. 4, the reflective electrode structure 35 is formed on each mesas M by a lift-off technique. Then, light emitting diodes can be fabricated through similar processes to the processes described above with reference to FIG. 6 to FIG. 11.

According to this embodiment, since the mesa M is formed prior to the reflective electrode structure 35, the pre-oxidation layer 29 can remain on side surfaces of the mesas M and in regions between the mesas M. Then, the pre-oxidation layer 29 is covered by the lower insulation layer 39 and is subjected to patterning together with the lower insulation layer 39.

Although various embodiments have been described above, it should be understood that other implementations are also possible. In addition, some features of a certain embodiment may also be applied to other embodiments in the same or similar ways without departing from the spirit and scope of the disclosed technology.

What is claimed is:

1. A light emitting diode (LED) module comprising:
a printed circuit board; and a light emitting diode bonded to an upper side of the printed circuit board, the light emitting diode comprising: a first conductive-type semiconductor layer; a mesa placed on the first conductive-type semiconductor layer and including an active layer and a second conductive-type semiconductor layer; a reflective electrode structure disposed on the mesa; a current spreading layer covering the mesa and the first conductive-type semiconductor layer, and having an opening exposing the reflective electrode structure, the current spreading layer being electrically connected to the first conductive-type semiconductor layer while being insulated from the reflective electrode structure and the mesa; and an upper insulation layer covering the current spreading layer, the upper insulation layer having a first opening exposing the current spreading layer to define a first electrode pad region, and a second opening exposing an exposed upper region of the reflective electrode structure to define a second electrode pad region, wherein the first electrode pad region and the second electrode pad region are bonded to corresponding pads on the printed circuit boards via solder pastes, respectively.

2. The LED module of claim 1, wherein the light emitting diode further comprises an anti-Sn diffusion plating layer formed on the first electrode pad region and the second electrode pad region.

3. The LED module of claim 1, wherein the light emitting diode further comprises an anti-diffusion reinforcing layer disposed on the reflective electrode structure in the opening of the current spreading layer, the anti-diffusion reinforcing layer being exposed through the second opening of the upper insulation layer.

4. The LED module of claim 3, wherein the anti-diffusion reinforcing layer is formed of the same material as that of the current spreading layer.

5. The LED module of claim 4, wherein the current spreading layer comprises an ohmic contact layer, a reflective metal layer, an anti-diffusion layer, and an anti-oxidation layer.

6. The LED module of claim 5, wherein the anti-diffusion layer comprises at least one metal layer selected from the group consisting of Cr, Ti, Ni, Mo, TiW and W layers, and the anti-oxidation layer comprises an Au, Ag or organic material layer.

7. The LED module of claim 6, wherein the anti-diffusion layer comprises at least two pairs of Ti/Ni or Ti/Cr layers.

8. The LED module of claim 5, wherein the current spreading layer further comprises a bonding layer disposed on the anti-oxidation layer.

9. The LED module of claim 4, wherein the solder paste adjoins the current spreading layer and the anti-diffusion reinforcing layer.

10. The LED module of claim 1,
wherein the reflective electrode structure comprises: a reflective metal section; a capping metal section; and an anti-oxidation metal section, the reflective metal section having a slanted side surface such that an upper surface of the reflective metal section has a narrower area than a lower surface thereof, and
wherein a stress relief layer is formed at an interface between the reflective metal section and the capping metal section.

11. The LED module of claim 1, wherein the mesa comprises elongated branches extending parallel to each other in one direction and a connecting portion at which the branches are connected to each other, and the opening of the current spreading layer is disposed on the connecting portion.

12. The LED module of claim 1, wherein the light emitting diode further comprises a lower insulation layer disposed between the mesa and the current spreading layer and insulating the current spreading layer from the mesa, the lower insulation layer having an opening that is disposed in an upper region of the mesa and exposes the reflective electrode structure.

13. The LED module of claim 12, wherein the opening of the current spreading layer has a greater width than the opening of the lower insulation layer such that the opening of the lower insulation layer is completely exposed therethrough.

14. The LED module of claim 13, wherein the light emitting diode further comprises an anti-diffusion reinforcing layer disposed within the opening of the current spreading layer and the opening of the lower insulation layer, the anti-diffusion reinforcing layer being exposed through the second opening of the upper insulation layer.

15. The LED module of claim 14, wherein the lower insulation layer comprises a silicon oxide layer and the upper insulation layer comprises a silicon nitride layer.

16. The LED module of claim 1, wherein the solder paste comprises Sn—Ag alloys, Sn—Bi alloys, Sn—Zn alloys, or Sn—Ag—Cu alloys.

17. A light emitting diode comprising:
a first conductive-type semiconductor layer;
a mesa disposed on the first conductive-type semiconductor layer and comprising an active layer and a second conductive-type semiconductor layer;
a reflective electrode structure disposed on the mesa;
a current spreading layer covering the mesa and the first conductive-type semiconductor layer, and having an opening exposing the reflective electrode structure, the current spreading layer being electrically connected to the first conductive-type semiconductor layer while being insulated from the reflective electrode structure and the mesa; and
an upper insulation layer covering the current spreading layer, the upper insulation layer having a first opening exposing the current spreading layer to define a first electrode pad region, and a second opening exposing an exposed upper region of the reflective electrode structure to define the second electrode pad region.

18. The light emitting diode of claim 17, further comprising:
an anti-diffusion reinforcing layer disposed on the reflective electrode structure in the opening of the current spreading layer,
wherein the anti-diffusion reinforcing layer is exposed through the second opening of the upper insulation layer, and is formed of the same material as that of the current spreading layer.

19. The light emitting diode of claim 18, further comprising:
anti-solder diffusion layers formed in the first opening and the second opening.

20. The light emitting diode of claim 18, wherein the current spreading layer comprises an ohmic contact layer, a reflective metal layer, an anti-diffusion layer, and an anti-oxidation layer.

* * * * *

UNITED STATES PATENT AND TRADEMARK OFFICE
CERTIFICATE OF CORRECTION

PATENT NO. : 9,520,534 B2  
APPLICATION NO. : 14/848242  
DATED : December 13, 2016  
INVENTOR(S) : Jong Hyeon Chae et al.

Page 1 of 1

It is certified that error appears in the above-identified patent and that said Letters Patent is hereby corrected as shown below:

In the Claims

Column 16, Lines 42-43, delete "the printed circuit boards" and insert -- the printed circuit board --, therefor.

Signed and Sealed this  
Twenty-first Day of February, 2017

Michelle K. Lee  
*Director of the United States Patent and Trademark Office*